United States Patent [19]

Horaguchi et al.

[11] Patent Number: 4,899,193
[45] Date of Patent: Feb. 6, 1990

[54] IMAGE RECORDING APPARATUS HAVING ADJUSTABLE OPTICAL SYSTEM

[75] Inventors: Yoichi Horaguchi, Nagoya; Takashi Tomizawa, Aichi; Shigeyuki Hayashi, Nagoya; Motoshi Ohno, Nagoya; Takashi Nakata, Nagoya, all of Japan

[73] Assignee: Brother Kogyo Kabushiki Kaisha, Aichi, Japan

[21] Appl. No.: 281,336

[22] Filed: Dec. 8, 1988

[30] Foreign Application Priority Data

Dec. 11, 1987 [JP] Japan .............................. 62-189349[U]

[51] Int. Cl.[4] .............................................. G03G 15/00
[52] U.S. Cl. ...................................... 355/55; 355/126; 355/228; 355/232
[58] Field of Search .................. 355/55, 21, 126, 32, 355/228, 232, 56, 57, 58, 210, 243, 237, 240

[56] References Cited

U.S. PATENT DOCUMENTS

| | | | |
|---|---|---|---|
| 4,647,187 | 3/1987 | Zahn et al. | 355/21 |
| 4,660,094 | 4/1987 | Yoshimoto et al. | 355/55 X |
| 4,745,438 | 5/1988 | Acquaviva et al. | 355/55 X |
| 4,769,673 | 9/1988 | Tomosada et al. | 355/55 X |
| 4,789,880 | 12/1988 | Mori et al. | 355/55 |
| 4,796,053 | 1/1989 | Nakamura et al. | 355/55 X |
| 4,825,252 | 4/1989 | Suzuki et al. | 355/32 |

Primary Examiner—A. C. Prescott
Attorney, Agent, or Firm—Oliff & Berridge

[57] ABSTRACT

An image recording apparatus for forming an image on an image recording medium is disclosed. The apparatus includes optical components for irradiating light to an original and for directing the light reflected from the original toward an exposure unit along which the image recording medium is movably provided. The optical components includes at least one lens and mirror. Positions, postures and orientations of these components are adjustable by the mechanical interconnection with adjusting means provided at external side of the apparatus.

5 Claims, 2 Drawing Sheets

IMAGE RECORDING APPARATUS HAVING ADJUSTABLE OPTICAL SYSTEM

BACKGROUND OF THE INVENTION

The present invention relates to an image recording apparatus such as a copying machine or a printer, and more particularly, to a type thereof in which optical components in an optical system are adjustably provided. Further, related U.S. patent applications have been filed bearing Ser. No. 281,215 filed on 12-8, 1988 (corresponding to Japanese Utility Model Application Nos. 62-191014 and 63-17646 ) and Ser. No. 281,327 filed on 12-8, 1988 (corresponding to Japanese Utility Model Application Nos. 62-189350, 62-191005 and 62-191O13).

A conventional image recording apparatus of this type has an optical system including various optical components such as lenses and mirrors adapted for changing a direction of a light path. Positions, postures and inclinations of the lenses and mirrors are adjusted when assembling these into the image recording apparatus.

In this case, however, when entire assembling of the apparatus is completed, the optical components such as the lens and mirror are disposed among many other ambient mechanical parts and components those other than the optical system, Therefore, if their positions and angular orientations are deviated during assembly, the other parts other than the optical system must be disassembled for adjustments of such deviations of the optical system components.

SUMMARY OF THE INVENTION

Accordingly, it is an object of this invention to provide an image recording apparatus which can facilitate fine adjustment of optical components such as a lens and a mirror without detachments of other components even after the completion of entire assembly.

To achieve this object, there is provided an image recording apparatus for forming an image on an image recording medium, which image corresponds to an image of an original comprising: a casing; a light source disposed in the casing; an exposure unit at which the image recording medium is exposed to light reflected at the original to form a latent image on the image recording medium; optical components for directing light from the light source and reflected at the original toward the exposure unit, the optical components being accommodated in the casing; supporting means for supporting the optical components within the casing, the supporting means being disposed in the casing and parts of the supporting means extending through the casing toward outside; and adjusting means for moving the supporting means within the casing. The adjusting means is disposed outside the casing and engageable with the parts of the supporting means.

With the use of this invention, since part of the supporting means for supporting the optical components such as a lens and a mirror is disposed outside the casing, the optical components can easily be adjusted by the adjusting means at an external side of the casing.

BRIEF DESCRIPTION OF THE DRAWINGS

An embodiment of this invention will be described below with reference to the accompanying drawings in which.

DETAILED DESCRIPTION OF THE PREFERRED EMBODIMENTS

A first embodiment of this invention will be described below with reference to FIGS. 1 thru 3.

Figure 1:
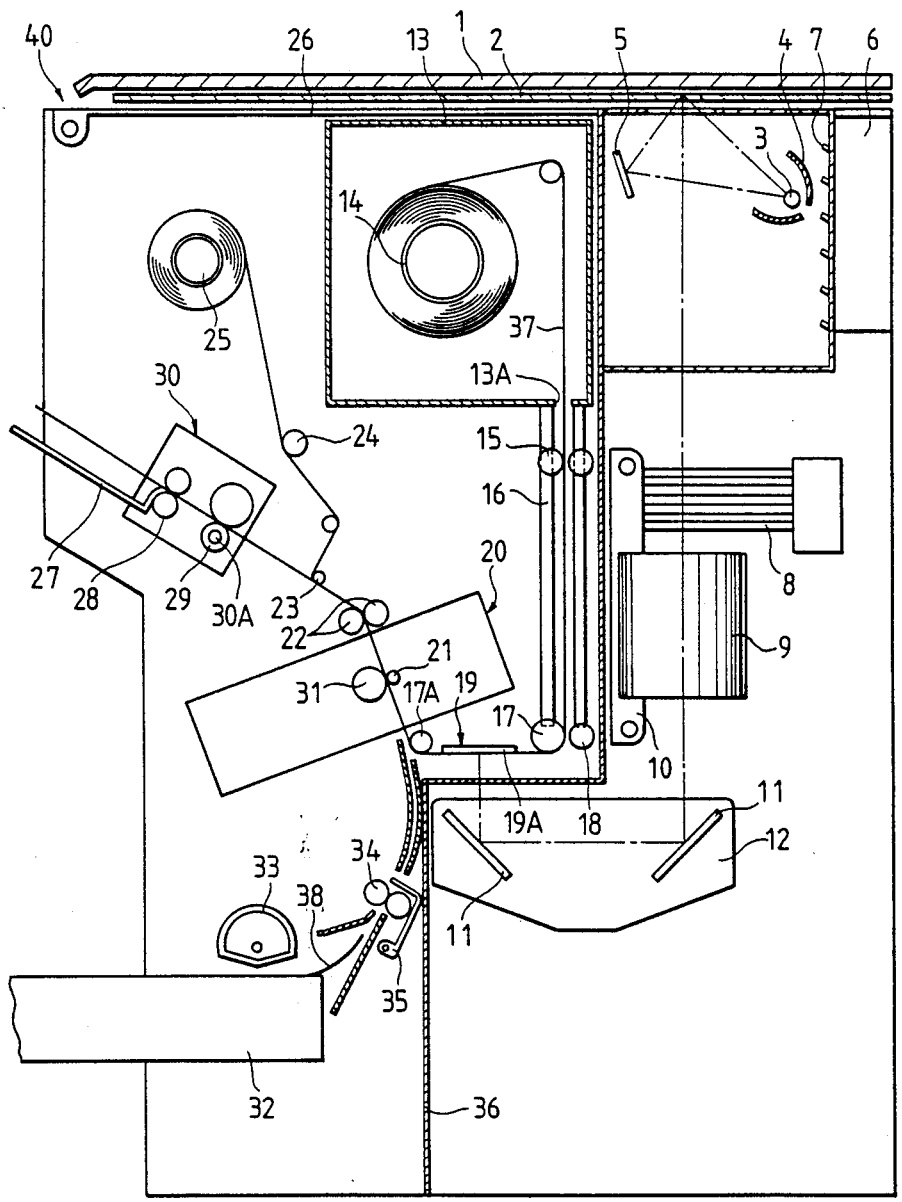
FIG. 1 is a schematic cross-sectional elevation illustrating an image recording apparatus according to one embodiment of this invention.

FIG. 1 shows a copying machine capable of performing a full-color copying. This copying machine employs a transfer type image recording mediums such as a photosensitive sheet which comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. Such image recording medium is disclosed in, for example, U.S. Pat. No. 4,399,209 and Japanese Patent Application Kokai No. 58-88739.

As shown in FIG. 1, the copying machine 40 generally includes an exposure unit 19 having an exposure stand 19A and a pressure developing unit 20. Further, a light shielding cover plate 36 is disposed in the apparatus to spacedly divide the apparatus into an optical system (described layer) and other requisite units. An elongated web-like microcapsule sheet 37 is wound around a cartridge shaft 14, and is retained in a microcapsule sheet cartridge 13 that is detachably disposed at a position immediately below an original support stand glass 2 and is formed with a bottom opening 13A. The exposure unit 19 is disposed below the sheet cartridge 13 at a downstream side thereof. The sheet 37 passes through a number of rollers and the pressure developing unit 20, and a leading end of the sheet 37 is attached to e take-up shaft 25 positioned beside the sheet cartridge 13.

Between the sheet cartridge 13 and the exposure unit 19, feed roller 15 and a barrel roller 17 are rotatably provided at a vertical sheet path for guide travel of the sheet toward the exposure unit. At the downstream side of the exposure unit 19, there is provided the pressure developing unit 20 which includes a small diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and a resist-gate 35 are provided so as to align leading edge of the developer sheet 38.

At downstream side of the pressure developing unit 20, a feed roller 17A is provided, and a pair of feed rollers 22 are also provided so as to provide constant running speed of the microcapsule sheet 37. This speed is coincident with a horizontally moving speed of the original support stand glass 2. At downstream Side of the feed rollers 21, a separation roller 23 is provided at which the microcapsule sheet 37 is separated from the developer sheet 38. The separate microcapsule sheet 37 is taken-up by the above mentioned take up means 25 through a meander travel control roller 24. On the other hand, thermal fixing unit 30 is provided at the downstream side of the separation roller 23. The thermal fixing unit 30 includes a hollow heat roller 29 in which heater element 30A is disposed. Further, a developer sheet feed roller 28 is provided to feed the image fixed developer sheet 38 toward a discharge tray 27.

In general operation of the copying apparatus, the microcapsule sheet 37 taken out through the opening 13A of the cartridge 13 is fed by the feed rollers 15 and guided by the barrel roller 17. The sheet 37 then passes in contact with a lower face of the exposure table 19A where original image carrying light is applied to the sheet 37, so that a latent image is formed on the sheet 37. The sheet is then fed to the pressure developing unit 20 by the guide roller 17A. At the pressure developing unit, the sheet 37 is pressurizingly superposed with the developer sheet 38. The microcapsule sheet 37 passing through the pressure developing unit 20 is then guided by the separation roller 23 and the meander travel adjusting roller 24 and is wound around the take-up shaft 25. An unexposed portion of the microcapsule sheet 37 leaving the cartridge 13 is kept unexposed to light by the shielding cover 36.

Since the conveying speed for the microcapsule sheet 37 is controlled to be constant by feed rollers 22 and is set equal to the moving speed of the original support stand glass 2, line latent images having given widths are sequentially formed on the microcapsule sheet 37 that is passing under the exposure table 19.

The developer sheets 38 are fed out one by one by the sector or woodruff roller 33, and each sheet 38 is fed to a sheet inlet of the pressure developing unit 20 after leading edge of the sheet 38 is aligned by developer sheet rollers 34 and the resist gate 35.

Accordingly, the microcapsule sheet 37 and the developer sheet 38 are fed in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction. After color development of the developer sheet 38 is progressed by the thermal fixing unit 30, this sheet 38 is fed out, with its image surface up, on a discharge tray 27.

On the other hand, the separated microcapsule sheet 37 passes through the meandering control roller 24 and is wound around the take-up shaft 25.

Next, an optical system incorporated in the copying machine 40 will be described. As shown in FIG. 1, the copying machine 40 has its top plate portion provided with a stand cover 1 and the original support stand glass 2. The original support stand glass is formed of light transmissive material and is movable in the horizontal direction and on which a desired original (not shown) is to be placed. At the upper one side section (right side in Fig. of the copying machine 40, fixedly provided is a light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leakage out of the apparatus.

To irradiate the light from the halogen lamp 3 on the original at a high efficiency, a flat reflector 5 is disposed on one side of the light source. The second reflector 5 is adapted to reflectingly direct lights which do not directly direct toward the original from the light source and concentrate such reflected light onto the original.

At another side of the halogen lamp 3 there are provided a fan 6 and a louver 7 for introducing an external air into the apparatus. Accordingly, air is effectively impinged onto the original support stand glass 2 to cool the same.

A filter 8 is disposed below the original support stand glass 2. Further, a lens 9 is provided below the filter 8. Light emitted from the halogen lamp 3 and reflected at the original placed on the original support stand glass 2 passes through the filter 8 and enters the lens 9. The filter 8 alters the light transmissive characteristic in accordance with the sensitivity characteristics of a microcapsule sheet 37, to thereby adjust the color tone of a copied output image. The lens 9 is fixedly secured to a lens mounting plate (a first supporting element), and fine angular adjustment of this lens with respect to a light path is achievable as described in detail later. A pair of reflection mirrors 11 and 11 are provided below the lens 9. The condensed lights passing through the lens 9 change their direction by 180 degrees (completely reverse direction) by the two reflection mirrors 11 and the thus oriented lights impinge on the microcapsule sheet 37 closely contacting the bottom of the exposure table 19 to form the latent image thereon. The two reflection mirrors 11 are securely mounted to a mirror mounting plate 12 (a second supporting element), so that the adjustment of the length of the light path and focusing adjustment can be effected by fine adjustment of the position of the mirror mounting plate 12.

Figure 2A:
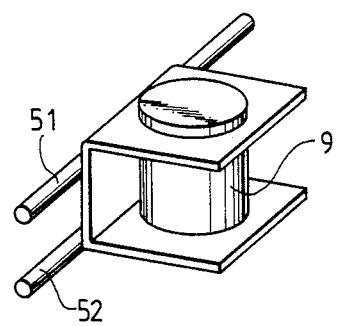
FIGS. 2(a) and 2(b) are segmental perspective views illustrating supporting members of optical components used in this embodiment.
Figure 2B:
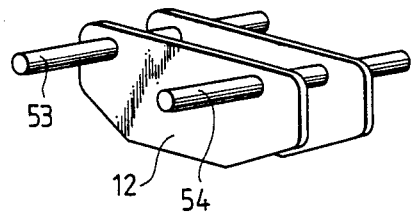
Figure 3:
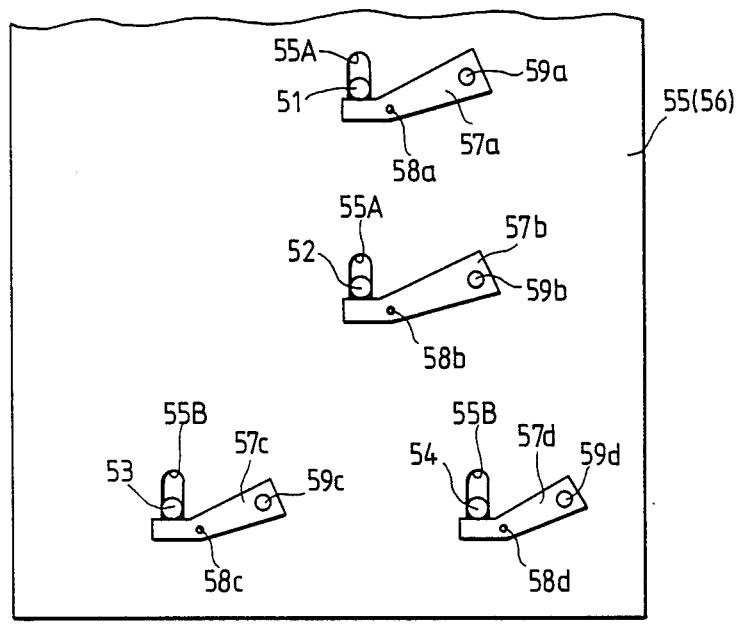
FIG. 3, is a front view illustrating an adjusting section provided at a casing of the apparatus according to this embodiment.

As shown in FIGS. 2(a) and 2(b), the lens mounting plate 10 and mirror mounting plate 12 are fixedly attached with their respective adjustment rods 51, 52 also the first supporting element), and 53, 54 (also the second supporting element), and these adjustment rods are slidably fitted in corresponding oblong slots 55A (first vertical slots) and 55B (second vertical slots) formed in a frame 55 shown in FIG. 3. Therefore, the lens 9 and the mirrors 11 are vertically movable when these guide rods are slidably moved with respect to the corresponding slots. Another frame 66 is also provided which confronts the frame 55. The frame 56 is also formed with slots identical with these first and second vertical slots. These rods, the lens mounting plate 10 and the mirror mounting plate 12 function as optical component supporting means for supporting the latter within the frames 55, 56, i e., within the casing of the apparatus.

As shown in FIG. 3, first levers 57a and 57b, and second levers 57c and 57d, those functioning as adjusting means are each pivotally connected to external sides of the frames 55 and 56 at their intermediate portions so as to be pivotable about each of pivot pins 58a thru 58d. Each one end of the levers 57 supports each end ends of the adjustment rods 51 to 54, that is, each one end of the levers supports the optical component supporting means at their external portion of the frames. Each other end of the levers 57 is provided with a corresponding bolt 59a thru 59d so as to maintain pivot position of the lever 57 by threadingly advancing the bolt 59 toward the outer surface of the frame 55. With respect to the opposite frame 56, exactly identical pivotal levers are provided.

Operation of the copying apparatus in conjunction with the movement of the original support stand glass 2 will be described:

The original support stand cover 1 is lifted up for mounting the original on the original support stand glass 2.

Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is coming into confrontation with the light source. Thereafter, with the halogen lamp 3 being lighted, the original support stand glass 2 is then moved in a second direction (leftwardly in FIG. 1) opposite to the first direction. The light emitted from the halogen lamp 3 is reflected at the original, and the reflected light passes through the filter 8 and lens 9 and is reflected at two reflection mirrors 11. The last reflected light is finally directed toward the microcapsule sheet 37 which is located under the exposure table 19 to form the latent image on the sheet 37. At this time since the microcapsule sheet 37 is moved under the exposure table 19 in the second direction (leftwardly in FIG. 1) at the same speed as the moving speed of the original support stand glass 2, the latent image corresponding to the original image is formed on the microcapsule sheet 37.

In timed relation with the movement of the original support stand glass 2 in the second direction, the woodruff roller 33 feeds out the developer sheets 38 one by one from the developer sheet cassette 32. The developer sheet 38 superposed on the light-exposed microcapsule sheet 37 is fed to the pressure developing unit 20, and the latent image on the microcapsule sheet 37 is developed and transferred onto the developer sheet 38.

Thereafter, the developer sheet 38 is subjected to thermal fixing in the thermal fixing unit 30 and is then discharged outside the copying machine 40. Meanwhile, the microcapsule sheet 37 leaving the pressure developing unit 20 is wound around the take-up shaft 25. When the movement of the original support stand glass 2 is stopped at a second position where another edge (right side in FIG. 1) of the glass 2 confronts the the light source, the copying of the original is completed and the halogen lamp 3 is turned off.

A description will now be given with respect to adjustment of optical components (lens 9 and reflection mirrors 11). Each of the adjustment rods 51 to 54 can be moved vertically by rocking the lever 57 about the associated pivot pins 58. Since each ends of the adjustment rods are supported by the adjusting levers 57, and since the adjustment rods extend between opposing frames 55 and 56, vertical position control with respect to each end of the rods can be independently performed. As a result, inclinations of these rods are adjustable, to thereby change positions and angular orientations of the lens 9 and the pair of reflection mirrors 11 and 11. In other words, the levers 57 can permit their respective adjustment rods 51 thru 54 to have free inclination angle between the frames 55 and 56.

Figure 4:
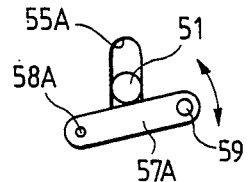
FIG. 4, is a front view illustrating a modification of the adjusting section according to a second embodiment of this invention.

Another adjusting mechanism is shown in FIG. 4 wherein like parts and components are designated by the same reference numerals and characters as those shown in FIG. 3. In the second embodiment, each of the adjusting levers 57A has one end pivotally supported to the frame 55 by a pivot pin 58A, and another end provided with a screw 59 which determines a temporarily fixed rocking position of the lever because of the pressure contact of a planar end of the screw with the wall 55. Each one end of the adjusting rod 51 is supported on an intermediate portion of the lever 57. Upon rocking movement Of the lever 57 about the pivot pin 58, vertical position of one end portion of the rod 51 is changeable, to thereby change orientation of the rod 51.

As described above, according to this invention, the adjustment of optical components can be externally performed without any detachment of other neighbouring components or parts.

Of course, this invention is in no way restricted to the above particular embodiment, but can be modified in various manners within the spirit and scope of the invention. For instance, instead of providing the adjustment rods, the lens mounting plate and mirror mounting plate may be designed so that part of each plate extends outside the frames 55 and 56.

According to this invention, since the supporting members for optical components extend outside the casing of the present apparatus, adjustment of the optical components can be easily conducted.

What is claimed is:

1. An image recording apparatus for forming an image on an image recording medium, which image corresponds to an image of an original comprising:

a casing;

a light source disposed in said casing;

an exposure unit at which said image recording medium is exposed to light reflected at said original to form a latent image on said image recording medium;

optical components for directing light from said light source and reflected at said original toward said exposure unit, said optical components being accommodated in said casing;

supporting means for supporting said optical components within said casing, said supporting means being disposed in said casing and parts of said supporting means extending through said casing toward outside; and adjusting means for moving said supporting means within said casing, said adjusting means being disposed outside said casing and engageable with said parts of said supporting means.

2. The image recording apparatus as defined in claim 1, wherein said image recording medium comprises a first image recording medium and a second image recording medium, said first image recording medium comprising a photosensitive pressure sensitive recording medium provided with microcapsules said microcapsules encapsulating therein a first material having first and second phases dependent on light exposure, and said second image recording medium comprising a developer medium provided with a second material which provides an output image upon reaction with said first material.

3. The image recording apparatus as defined in claim 1 wherein said optical components comprises at least one lens and at least one mirror, said lens and said mirror being disposed at a light path extending from said original and said exposure unit.

4. The image recording apparatus as defined in claim 3 wherein said casing has first and second frames confronting with each other, at least one of said frames being formed with first and second vertical slots, and wherein said supporting means comprises a first supporting element for supporting said lens, and a second supporting element for supporting said mirror, a part of said first supporting element extending through said first vertical slot and movable with respect thereto, and a part of said second supporting element extending through said second vertical slot and movable with respect thereto.

5. The image recording apparatus as defined in claim 4 wherein said adjusting means comprises a first lever pivotally connected to said frame, said part of said first supporting element being mounted on said first lever; and a second lever pivotally connected to said frame, said part of said second supporting element being mounted on said second lever.

* * * * *